United States Patent
Bosco et al.

[11] Patent Number: 5,852,395
[45] Date of Patent: Dec. 22, 1998

[54] ROGOVSKI COIL

[75] Inventors: Antonio Bosco, Wikon; Andrzej kaczkowski, Würenlingen; Manfred Seidel, Fislisbach, all of Switzerland

[73] Assignee: Asea Brown Boveri AG, Baden, Switzerland

[21] Appl. No.: 909,738

[22] Filed: Aug. 12, 1997

[30] Foreign Application Priority Data

Oct. 4, 1996 [DE] Germany ................ 196 40 981.0

[51] Int. Cl.$^6$ .............. H01F 27/28; H01F 5/00; H01F 38/20
[52] U.S. Cl. ............ 336/174; 336/200; 336/225
[58] Field of Search ................... 336/174, 175, 336/173, 225, 224, 207, 208

[56] References Cited

U.S. PATENT DOCUMENTS

| | | | |
|---|---|---|---|
| 3,885,213 | 5/1975 | Rioux et al. ............. | 324/127 |
| 4,727,316 | 2/1988 | Shen et al. ............. | 336/181 |
| 5,414,400 | 5/1995 | Gris et al. ............. | 336/174 |
| 5,442,280 | 8/1995 | Baudart ............. | 324/127 |

FOREIGN PATENT DOCUMENTS

| | | |
|---|---|---|
| 0122133A1 | 10/1984 | European Pat. Off. . |
| 0573350A1 | 12/1993 | European Pat. Off. . |
| 0652441A1 | 5/1995 | European Pat. Off. . |
| 3544508A1 | 6/1987 | Germany . |
| 4424368A1 | 7/1995 | Germany . |
| 2259150 | 3/1993 | United Kingdom . |

*Primary Examiner*—Michael L. Gellner
*Assistant Examiner*—Anh Mai
*Attorney, Agent, or Firm*—Burns, Doane, Swecker & Mathis. L.L.P.

[57] ABSTRACT

The Rogovski coil (1) is provided with a winding (2) applied to a winding support made from an insulating material. It has a central axis (4) and an opening (5), which is enclosed by the winding support and is penetrated by the central axis (4). A particularly homogeneous winding (2) and, associated therewith, very accurate current measurement are achieved by virtue of the fact that a surface, facing the central axis (4), of the winding support is provided with first stops (7), which are distributed on the circumference, extend in the direction of the central axis (4), and divide the winding (2) into winding segments (9). In this case, the spacing between in each case two of the first stops (7) is always an integral multiple of the diameter (D) of the wire forming the winding (2).

9 Claims, 1 Drawing Sheet

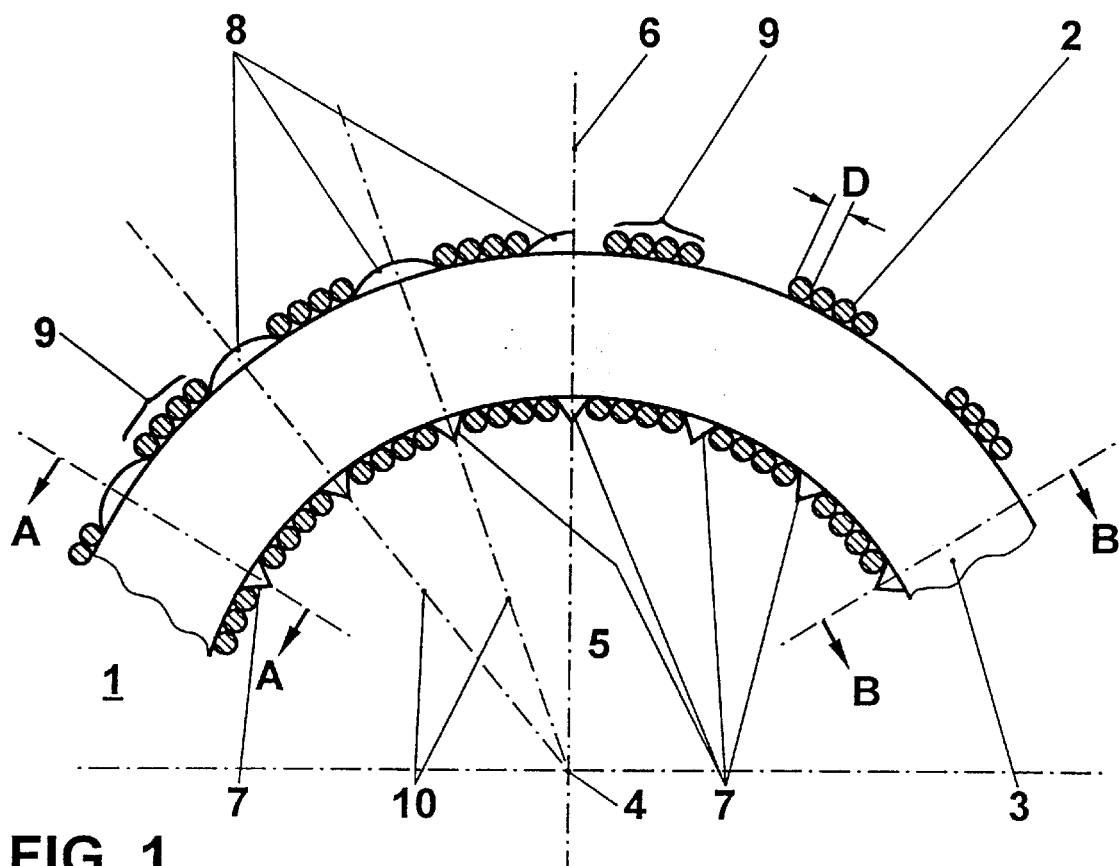
FIG. 1
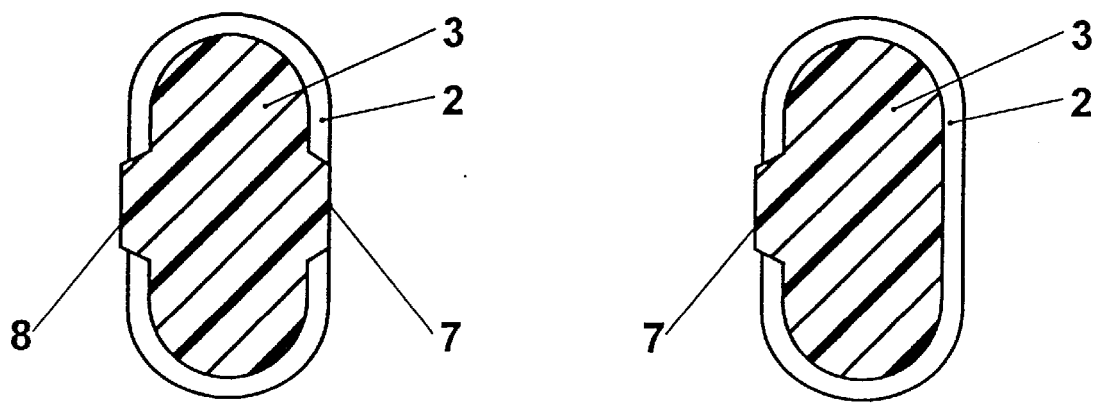
FIG. 1a  FIG. 1b

ROGOVSKI COIL

BACKGROUND OF THE INVENTION

1. Field of the Invention

The invention proceeds from a Rogovski coil in accordance with the preamble of claim 1.

2. Discussion of Background

The Rogovski coil and its application are described in German Offenlegungsschrift DE-3 544 508 A1. The Rogovski coil is used in this Offenlegungschrift in a current-measuring device which can be used in metal-enclosed gas-insulated switching stations. If, as in the case of power distribution, accurate current measurements are required, this Rogovski coil must be provided with a particularly homogeneous winding. However, this problem is not discussed in the described embodiment of the Rogovski coil.

SUMMARY OF THE INVENTION

Accordingly, one object of the invention as defined in the independent patent claims is to provide a novel Rogovski coil in which a particularly homogeneous winding is achieved using simple means.

The Rogovski coil according to the invention is suitable for particularly accurate current measurements. The segmentation of the winding permits any small inaccuracies, which can always occur during winding, to be compensated with high reliability. When particularly thin wire is used for the windings of a Rogovski coil, it can happen that the thickness of the wire insulation fluctuates. The influence of these thickness fluctuations is reduced by the consistent segmentation of the winding, in particular even when the number of the turns per winding segment is kept small. The numbers from three to eight turns per segment have proved to be particularly expedient. Particularly homogeneous windings of Rogovski coils are achieved when these windings are of single-layer design.

When they are constructed projecting inwards or outwards, the stops provided for segmenting the winding can additionally be used for accurate positioning of the Rogovski coil at its installation site.

Further exemplary embodiments of the invention, and the advantages attainable thereby are explained in more detail below with the aid of a drawing, which represents only one possible embodiment.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1 shows a schematically represented detail of a Rogovski coil, a first embodiment of the Rogovski coil being shown in the left-hand half of the FIG., and a second embodiment of the Rogovski coil being shown in the right-hand half, FIG. 1 shows a partial section, designated by A—A in FIG. 1, through the first embodiment of the Rogovski coil, and FIG. 1b shows a partial section, designated by B—B in FIG. 1, through the second embodiment of the Rogovski coil.

All elements not necessary for immediately understanding the invention are not represented.

DESCRIPTION OF THE PREFERRED EMBODIMENTS

Referring now to the drawings, wherein like reference numerals designate identical or corresponding parts throughout the several views, FIG. 1 shows a schematically represented detail of a Rogovski coil 1. This Rogovski coil 1 has a winding 2 made from an insulated metal wire having a circular cross section, which is wound uniformly around the torus 3 produced, as a rule cast, from an insulating material. The metal wire has a diameter D. The torus 3 is constructed circularly around a central axis 4 which extends at right angles to the plane of the drawing of FIG. 1. The torus 3 here has a cross section which is essentially rectangular, the narrow sides of the rectangle being rounded, as is to be seen from FIGS. 1a and 1b. Depending on the envisaged use of the Rogovski coil 1, other cross-sectional shapes are also conceivable for the torus 3, in particular also circular or elliptical cross sections.

The torus 3 of the Rogovski coil 1 encloses a cylindrically constructed opening 5, which extends in the direction of the central axis 4. The conductor (not represented) is led through this opening 5, specifically through the center thereof, as a rule. The current flowing in this conductor is measured with the aid of the Rogovski coil 1. A separating line 6 is drawn at right angles to the central axis 4. A first embodiment of the Rogovski coil 1 is represented to the left of this separating line 6. FIG. 1a shows a partial section, which is designated by A—A in FIG. 1, through this first embodiment of the Rogovski coil. Integrally formed on the surface, facing the central axis 4, of the torus 3 at regular spacings matched to the diameter D of the wire of the winding 2 are stops 7 which extend in the direction of a central axis 4. The spacings are dimensioned in integral multiples of the diameter D. The stops 7 have a triangular cross section here, for example. The individual stops 7 are spaced apart such that the interspace between them is just filled by a single-layer winding 2, the insulating coverings of the wires of the individual turns thus touching in this case. It is always the same number of turns, which form a winding segment 9, which find room between in each case two stops 7. However, the stops 7 do not extend over the entire length of the torus 3. It has proved to be advantageous to have a number of 3 to 8 turns as the number of turns of such a winding segment 9 bounded by the stops 7. Given this comparatively small number of turns, the small interspaces in the winding 2 which are caused by the stops 7 suffice to accommodate any differences in the wire diameter D which are caused, for example, by a different thickness of the insulating covering of the winding wire.

In this first embodiment, there are also integrally formed on the surface, averted from the opening 5, of the torus 3 stops 8 which likewise extend axially over the part of the length of the torus 3 and are of spherical shape. It is always the same number of turns, which form the winding segment 9, which find room between in each case two stops 8. The stops 7 and 8 are assigned to one another in pairs in each case such that such that their centers lie on an axis 10 emanating radially from the central axis 4.

It is also conceivable that the stops 7 are omitted in a further embodiment of the Rogovski coil 1, so that only the stops 8 are available for dividing the winding 2 into equal winding segments 9.

Represented to the right of this separating line 6 is a second, somewhat simplified embodiment of the Rogovski coil 1. Only the already described, uniformly spaced apart stops 7 are provided in this embodiment. FIG. 1b shows a partial section, which is designated by B—B in FIG. 1, through this second embodiment of the Rogovski coil. Integrally formed on the surface, facing the central axis 4, of the torus 3 at regular spacings matched to the diameter D of the wire of the winding 2 are stops 7 which extend in the direction of a central axis 4. The spacings are dimensioned in integral multiples of the diameter D, so that, as well, in each case one winding segment 9 finds room between the stops 7.

A particularly homogeneous distribution of the turns on a torus 3 is achieved by this consistent division of the winding 2 into individual winding segments 9 which, owing to the stops 7 and 8 which separate them mechanically, all have the same number of turns. This particularly homogeneously designed winding 2 permits a particularly accurate determination of the current flowing through the enclosed conductor. It is now possible to use this particularly homogeneously wound Rogovski coil 1 to produce current transformers which meet the requirements for accuracy of the 0.1 transformer class, that is to say these current transformers measure the current with an error of less than 0.1%.

The installation of the Rogovski coil 1 is facilitated when the stops 7 project somewhat beyond the diameter of the winding 2 in the direction of the central axis 4, since this coil can be pushed onto an appropriately dimensioned shoulder of the housing, so the coil is arranged concentrically relative to the conductor. The Rogovski coil 1 need then only be secured in one of the known ways against slipping off this shoulder. This type of assembly greatly facilitates the installation of the Rogovski coil 1, since complicated adjustment is eliminated. Another variant of the installation results when the stops 8 project radially away from the central axis beyond the winding 2. This coil can then be pushed into a matched cutout, enclosing them, of the enclosing housing in such a way that the stops 8 take over centering the Rogovski coil 1. In this type of assembly, as well, there is no need for complicated adjustment of the Rogovski coil 1.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A Rogovski coil comprising:
   a winding applied to a winding support made from an insulating material, said winding including a central axis having an opening which is enclosed by the winding support and penetrated by the central axis,
   wherein a surface, facing the central axis, of the winding support is provided with first stops, which are distributed on a circumference, extend in a direction of the central axis, and divide the winding into winding segments, and
   wherein a spacing between two of the first stops is always an integral multiple of the diameter of the wire forming the winding.

2. The Rogovski coil as claimed in claim 1, wherein
   a surface, averted from the central axis, of the winding support is provided with second stops, which are distributed on the circumference, extend in the direction of the central axis, and divide the winding into winding segments,
   wherein a spacing between two of the second stops is equal to the spacing between two said first stops, and
   wherein each said first stop and each said second stop are assigned to one another such that their centers lie on an axis emanating radially from the central axis.

3. The Rogovski coil as claimed in claim 1, wherein all the winding segments have the same number of turns.

4. The Rogovski coil as claimed in claim 1, wherein the winding is of single-layer design.

5. The Rogovski coil as claimed in claim 1, wherein the number of turns per winding segment is in the range of three to eight.

6. The Rogovski coil as claimed in claim 1, wherein the first stops project beyond the winding in the direction of the central axis.

7. The Rogovski coil as claimed in claim 1, wherein the winding support is constructed as a torus.

8. A Rogovski coil comprising:
   a winding applied to a winding support made from an insulating material, said winding including a central axis having an opening which is enclosed by the winding support and penetrated by the central axis,
   wherein a surface, averted from the central axis, of the winding support is provided with second stops, which are distributed on a circumference, extend in a direction of the central axis, and divide the winding into winding segments, and
   wherein a spacing between two of the second stops is always an integral multiple of the diameter of the wire forming the winding.

9. The Rogovski coil as claimed in claim 8, wherein the second stops project radially away from the central axis beyond the winding.

* * * * *